US009685494B2

(12) United States Patent
Odaka et al.

(10) Patent No.: US 9,685,494 B2
(45) Date of Patent: Jun. 20, 2017

(54) ORGANIC EL DISPLAY DEVICE

(71) Applicant: Japan Display Inc., Tokyo (JP)

(72) Inventors: Kazuhiro Odaka, Tokyo (JP); Jun Hanari, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 136 days.

(21) Appl. No.: 14/823,509

(22) Filed: Aug. 11, 2015

(65) Prior Publication Data

US 2016/0056222 A1    Feb. 25, 2016

(30) Foreign Application Priority Data

Aug. 22, 2014  (JP) ................. 2014-169758

(51) Int. Cl.
| | |
|---|---|
| *H01L 23/48* | (2006.01) |
| *H01L 27/32* | (2006.01) |
| *G02F 1/00* | (2006.01) |
| *H05K 1/11* | (2006.01) |
| *H05K 3/32* | (2006.01) |
| *H05K 3/36* | (2006.01) |

(52) U.S. Cl.
CPC ............ *H01L 27/3297* (2013.01); *G02F 1/00* (2013.01); *H01L 27/3276* (2013.01); *H05K 1/117* (2013.01); *H05K 3/323* (2013.01); *H05K 3/361* (2013.01); *H05K 2201/0367* (2013.01); *H05K 2201/0979* (2013.01); *H05K 2201/10136* (2013.01)

(58) Field of Classification Search
CPC ................. H01L 27/3297; H01L 27/3276
USPC ............................................. 313/512
See application file for complete search history.

(56) References Cited

U.S. PATENT DOCUMENTS

| | | | | | |
|---|---|---|---|---|---|
| 7,636,145 | B2* | 12/2009 | Jung | ................. | G02F 1/13458 349/149 |
| 7,733,456 | B2* | 6/2010 | Lee | ................. | G02F 1/13458 349/138 |
| 2002/0067452 | A1 | 6/2002 | Sakamoto et al. | | |
| 2005/0206828 | A1* | 9/2005 | Lee | ................. | H01L 27/3276 349/149 |
| 2006/0244741 | A1* | 11/2006 | Kimura | ............... | G02F 1/13452 345/204 |

FOREIGN PATENT DOCUMENTS

JP         2000-221540 A      8/2000

* cited by examiner

*Primary Examiner* — Nimeshkumar Patel
*Assistant Examiner* — Christopher Raabe
(74) *Attorney, Agent, or Firm* — Typha IP LLC

(57) ABSTRACT

A terminal is formed on a substrate. An anisotropic conductive film is disposed on the terminal. A flexible printed board is connected to the terminal via the anisotropic conductive film. At least one opening is formed in the terminal. An adhesion reinforcing portion as a projection is formed inside the opening. The adhesion reinforcing portion is formed of a material having higher adhesion to the anisotropic conductive film than a material constituting the surface of the terminal, and is adhered to the anisotropic conductive film.

20 Claims, 8 Drawing Sheets

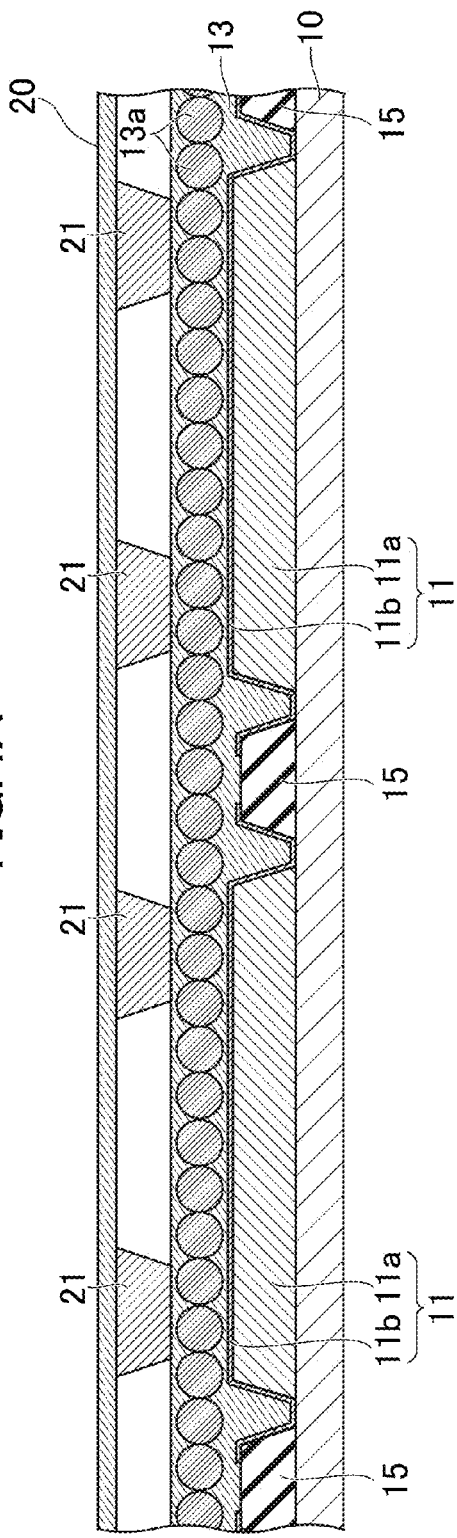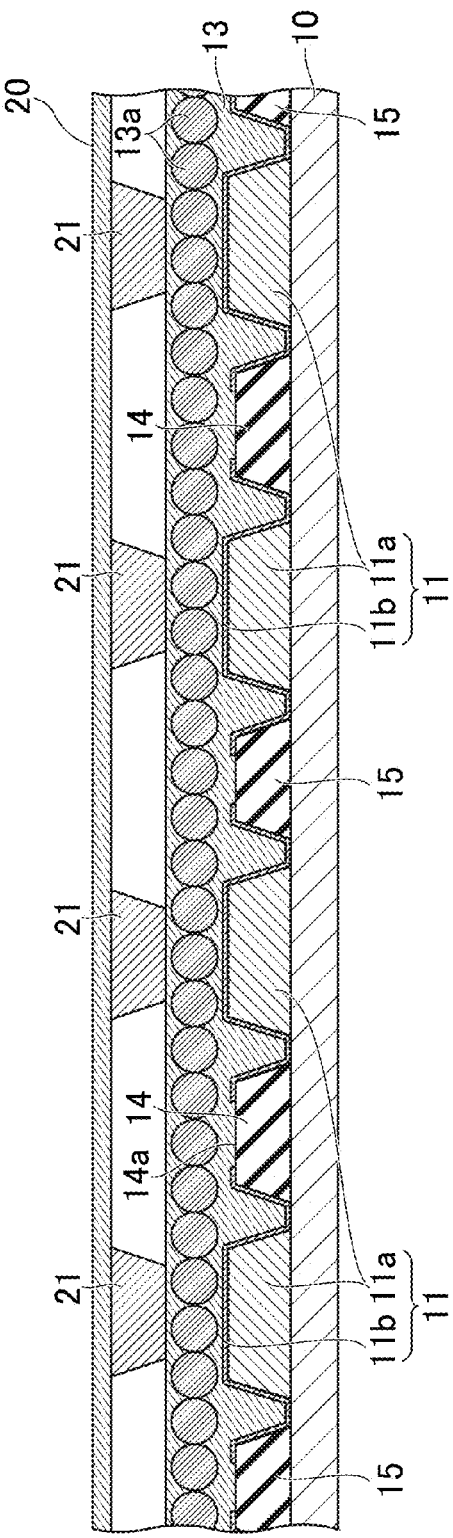

ORGANIC EL DISPLAY DEVICE

CROSS-REFERENCE TO RELATED APPLICATION

The present application claims priority from Japanese application JP2014-169758 filed on Aug. 22, 2014, the content of which is hereby incorporated by reference into this application.

BACKGROUND OF THE INVENTION

1. Field of the Invention

The present invention relates to a structure of connection between a flexible printed board and a terminal provided at the peripheral portion of a substrate included in a display device.

2. Description of the Related Art

A substrate included in a display device such as a liquid crystal display device or an organic EL display device includes a plurality of terminals at the peripheral portion thereof. A flexible printed board (hereinafter "FPC") is connected to the terminals. Various signals (e.g., a video signal) are input to the substrate of the display device via the FPC. A substrate of an organic EL display device includes, at the peripheral portion thereof, terminals of current supply lines. The FPC is also connected to the terminals of the current supply lines. For the connection between the terminals (these are provided on the substrate) and the FPC, an anisotropic conductive film is used in many cases.

SUMMARY OF THE INVENTION

In some cases, the surface of the terminal is formed of a material having poor adhesion to the anisotropic conductive film.

For example, in order to prevent the corrosion of metal constituting the terminal, the surface of the metal is covered with ITO (Indium Tin Oxide) in some cases. In such a structure using ITO, since adhesion between ITO and the anisotropic conductive film is poor, it is hard to secure the stability of connection between the terminals of the substrate and the FPC. The terminals contact an FPC for inspecting the display device in a manufacturing step of the display device, and the terminals are connected to the above-described FPC via the anisotropic conductive film after the inspection. In some cases, the width of the terminal is set somewhat large. Such a terminal has a problem that it is hard to secure the stability of connection particularly with the FPC.

It is an object of the invention to provide a display device capable of securing the stability of connection between a terminal (it is formed on a substrate) and a flexible printed board.

A display device according to an aspect of the invention includes: a substrate including a display region and a terminal formed in a region outside the display region; an anisotropic conductive member disposed on the terminal; a flexible printed board connected to the terminal via the anisotropic conductive member; at least one opening formed in the terminal; and a first projection formed of a material having higher adhesion to the anisotropic conductive member than a material constituting a surface of the terminal, disposed inside the opening of the terminal, and adhered to the anisotropic conductive member. According to the display device, it is possible to secure the stability of connection between the terminal formed on the substrate of the display device and the flexible printed board.

BRIEF DESCRIPTION OF THE DRAWINGS

FIG. 4A is a cross-sectional view taken along a cutting plane indicated by the line IVa-IVa in FIG. 3.

FIG. 4B is a cross-sectional view taken along a cutting plane indicated by the line IVb-IVb in FIG. 3.

DETAILED DESCRIPTION OF THE INVENTION

Figure 1:
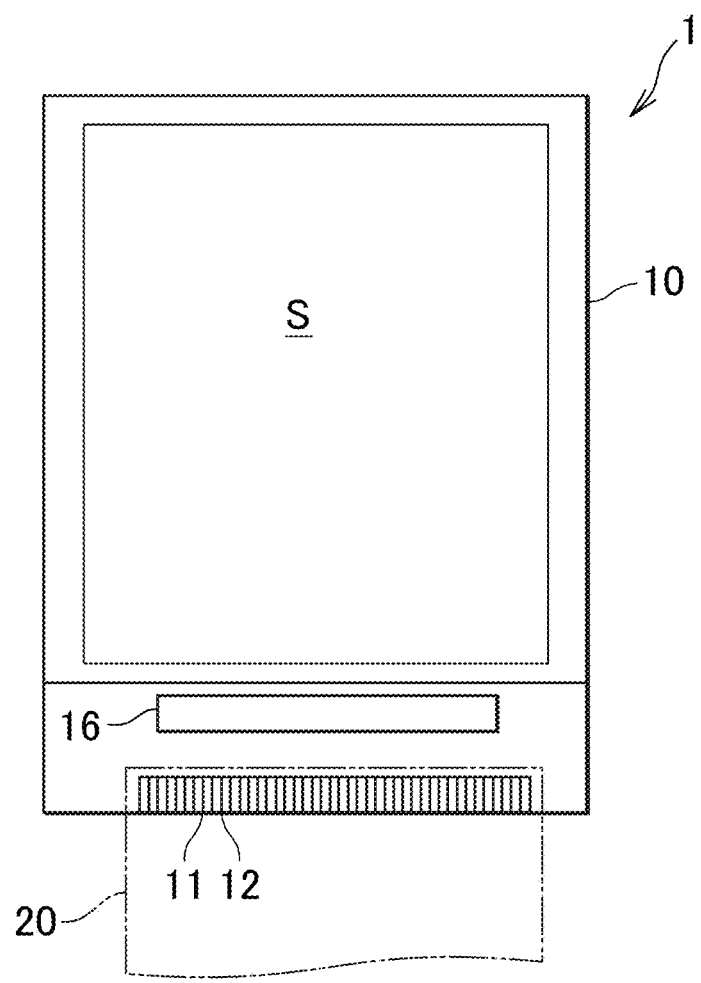
FIG. 1 is a plan view of a substrate included in a display device according to the invention.
Figure 2:
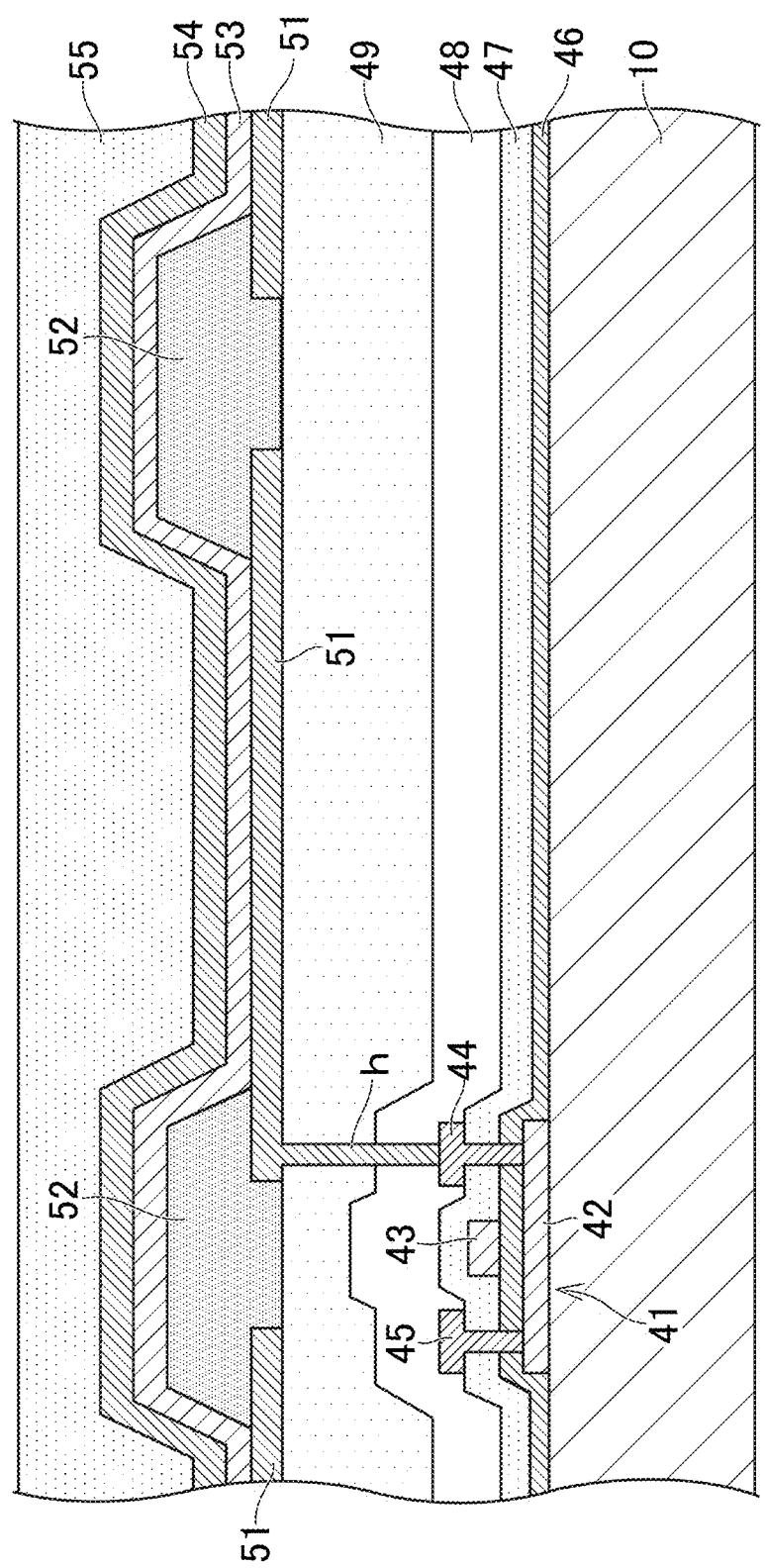
FIG. 2 is a cross-sectional view of the display device in a display region, showing an example of a stacked structure formed in the display region.
Figure 3:
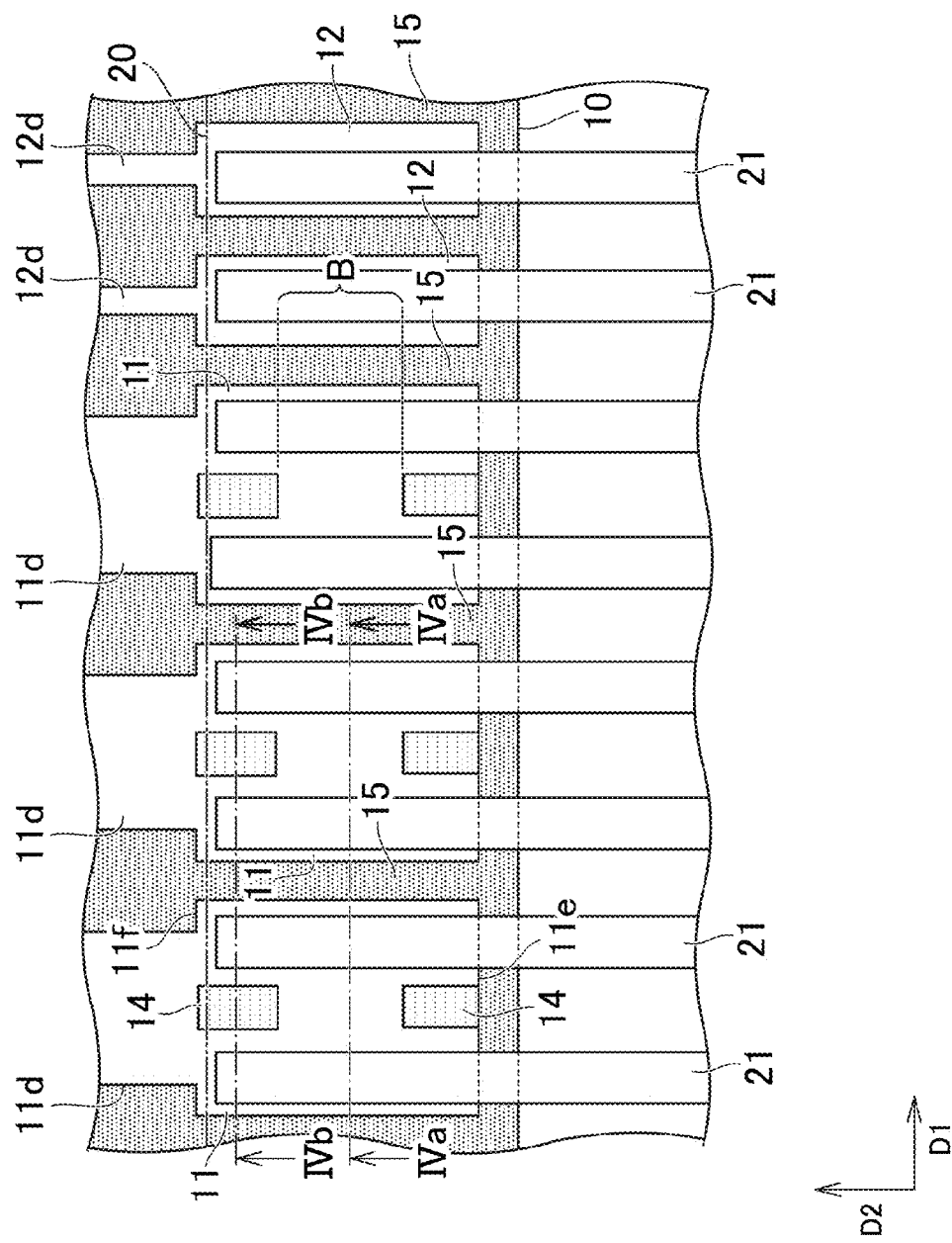
FIG. 3 is a plan view showing a positional relationship between terminals formed on the substrate and terminals of a flexible printed board.

Hereinafter, an embodiment of the invention will be described with reference to the drawings. FIG. 1 is a plan view of a substrate 10 included in a display device 1 according to the invention. FIG. 2 is a cross-sectional view of the display device 1 in a display region S, showing an example of a stacked structure formed in the display region S. FIG. 3 is a plan view showing a positional relationship between terminals (specifically, shared terminals 11 and dedicated terminals 12) and terminals 21 of a flexible printed board 20. Hereinafter, the flexible printed board is referred to as "FPC". FIGS. 4A and 4B are cross-sectional views showing a structure of connection between the substrate 10 and the FPC 20. FIG. 4A is a cross-sectional view taken along a cutting plane indicated by the line IVa-IVa in FIG. 3; and FIG. 4B is a cross-sectional view taken along a cutting plane indicated by the line IVb-IVb in FIG. 3. The display device 1 of an example described herein is an organic EL display device. However, the invention may be applied to another type of display device such as a liquid crystal display device. In the embodiment described herein, the shared terminals 11 correspond to a first terminal and a second terminal of the invention, while the dedicated terminals 12 correspond to a third terminal of the invention.

The display device 1 includes the substrate 10. The substrate 10 is, for example, a glass substrate or a resin substrate. The substrate 10 is provided with the display region S in which a plurality of pixels are aligned in the vertical and horizontal directions. As shown in FIG. 2, a stacked structure composed of a plurality of layers is formed in the display region S. Specifically, the stacked structure of the display region S is composed of an organic layer including a light-emitting layer, an insulating film, TFTs (Thin Film Transistors), wires, and the like.

Driver TFTs 41 are formed on the substrate 10. The driver TFT 41 includes at least a layer of insulating film. The driver TFT 41 is shown in FIG. 2. The driver TFT 41 is provided in each of the pixels, and connected to a lower electrode 51 described later. The driver TFT 41 includes a semiconductor layer 42, a gate electrode 43, and source and drain electrodes 44 and 45. In the example shown in FIG. 2, the semiconductor layer 42 is formed on the substrate 10. A gate insulating film 46 is formed between the semiconductor layer 42 and the gate electrode 43. The gate electrode 43 is covered with an interlayer insulating film 47. The source and drain electrodes 44 and 45 are formed on the interlayer insulating film 47. A circuit layer includes the driver TFTs 41 and the insulating films 46 and 47. The circuit layer includes switching TFTs (not shown) to turn on or off the driver TFTs 41, scanning lines (gate lines) to which a scanning signal to turn on the switching TFTs, video signal lines to which a video signal corresponding to the gray-scale value of each of the pixels connected to the switching TFTs too. The scanning signal and the video signal are applied from a driver IC 16 (refer to FIG. 1). Moreover, current supply lines for supplying a current to an organic layer 53 described later via the driver TFTs 41 are formed in the circuit layer. A power supply voltage is applied to the current supply line via the FPC 20 described later. The circuit layer is covered with a passivation film 48, and a planarization film 49 is formed on the passivation film 48.

As shown in FIG. 2, the stacked structure of the display region S includes the lower electrodes 51 each of which is provided in the pixel. In the example of FIG. 2, the lower electrode 51 is formed on the planarization film 49. The lower electrode 51 is connected via a contact hole to one of the two electrodes (the source and drain electrodes 44 and 45) of the driver TFT 41. For example, the lower electrode 51 is an anode, while an upper electrode 54 described later is a cathode. The display device 1 includes a bank 52 that defines the pixels. The organic layer 53 including the light-emitting layer (not shown) is formed on the lower electrodes 51 and the bank 52. As shown in FIG. 2, the upper electrode 54 is formed on the organic layer 53. The upper electrode 54 is formed over the plurality of pixels. A sealing film 55 is formed on the upper electrode 54.

As described above, the display device 1 may be a liquid crystal display device. In this case, also in a display region of the liquid crystal display device, TFTs each of which is provided in the pixel, a gate insulating film formed between a gate electrode of the TFT and a semiconductor layer, and an interlayer insulating film formed between the gate electrode and drain and source electrodes are formed.

As shown in FIG. 1, a plurality of terminals (specifically, the shared terminals 11 and the dedicated terminals 12) is formed at a peripheral portion (i.e., a region outside the display region S) of the substrate 10. In the example shown in FIG. 1, the shared terminals 11 and the dedicated terminals 12 are formed at the lower portion of the substrate 10, and aligned in a direction along the lower edge of the substrate 10 (specifically, the right-and-left direction). The shared terminals 11 are connected with the FPC 20 in the use of the display device 1, and also may be used in inspection as will be described later. The position of the shared terminal 11 and the dedicated terminal 12 is not limited to this example. For example, the shared terminal 11 and the dedicated terminal 12 may be aligned along the right, left, or upper edge of the substrate 10. The driver IC 16 is mounted on the substrate 10 of the example shown in FIG. 1. Moreover, in the example shown in FIG. 3, the shared terminal 11 is provided at an end of an electrical line 11d, while the dedicated terminal 12 is provided at an end of an electrical line 12d. In one example, the wires 11d and 12d are connected to the driver IC 16. The electrical line 11d and the electrical line 12d may be connected to electrical lines formed in the display region S. As shown in FIG. 3, the size of the shared terminal 11 is different from the size of the dedicated terminal 12 . More specifically, the width of the shared terminal 11 is larger than the width of the dedicated terminal 12 (in the specification, the "width" is the size in a direction in which the shared terminal 11 and the dedicated terminal 12 are aligned (a direction indicated by D1 in FIG. 3)). The display device 1 includes the FPC (Flexible Printed Circuit) 20 connected to the shared terminals 11 and the dedicated terminals 12. The video signal or power supply voltage is applied to the display device 1 via the FPC 20. As will be described later, the shared terminals 11 are also used for the inspection of the display device 1 (more specifically, the substrate 10 on which the stacked structure described above is formed). That is, in the inspection of the display device 1, an FPC for inspection connects with (contacts) the shared terminals 11. The FPC 20 connects with the shared terminals 11 and the dedicated terminals 12 after the inspection of the display device 1.

The shared terminal 11 of the example described herein includes a terminal main body 11a formed of metal as shown in FIGS. 4A and 4B. The material of the terminal main body 11a is the same as that of the electrical lines (e.g., the gate line) formed in the display region S. The material of the terminal main body 11a is, for example, Al, Mo, Ti, Cu, or the like . The upper and side surfaces of the terminal main body 11a are covered with a coating film 11b . For the material of the coating film 11b, the same material as that constituting the electrodes formed in the display region S may be used. In this case, the coating film 11b and the electrodes formed in the display region S may be formed simultaneously in the manufacturing process of the display device. The material of the coating film 11b is, for example, ITO (Indium Tin Oxide). The coating film 11b prevents corrosion of the terminal main body 11a. The material of the coating film 11b is not limited to this. Also, the dedicated terminal 12 includes, similarly to the shared terminal 11, a terminal main body formed of metal and a coating film that covers the surface of the terminal main body.

As shown in FIGS. 3 to 4B, an anisotropic conductive film 13 is disposed on the shared terminals 11 and the dedicated terminals 12. The shared terminals 11 and the dedicated terminals 12 are connected to the terminals 21 of the FPC 20 via the anisotropic conductive film 13. Hereinafter, the anisotropic conductive film is referred to as "ACF". In other words, the FPC 20 is attached to the shared terminals 11 and the dedicated terminals 12 via the ACF 13. The ACF 13 is formed of resin (e.g., thermosetting resin) including conductor particles 13a. The shared terminals 11 and the dedicated terminals 12 are electrically connected to the respective corresponding terminals 21 via the ACF 13. In the example described herein, two terminals 21 are connected to one shared terminal 11. On the other hand, one terminal 21 is connected to one dedicated terminal 12. In the example of FIGS. 3 to 4B, the terminals 21 of the FPC 20, which are connected to the shared terminals 11, and the terminals 21 thereof, which are connected to the dedicated terminals 12, are disposed at equal intervals. According to the arrangement of the terminals 21 described above, complication of a manufacturing step of the FPC 20 can be suppressed compared to the case where the intervals of the terminals 21 are different depending on positions. The correspondence relationship between the terminals 21 of the FPC 20 and the shared terminals 11 and the dedicated terminals 12 of the substrate 10 is not limited to this. For example, one terminal 21 may be connected to one shared terminal 11. In this case, the terminal 21 of the FPC 20, which is connected to the shared terminal 11, may have a different width from that of the terminal 21 of the FPC 20, which is connected to the dedicated terminal 12.

At least one opening is formed in the shared terminal 11. As shown in FIGS. 3 and 4B, a first adhesion reinforcing portion 14 that adheres to the ACF 13 is formed inside the opening of the shared terminal 11. The adhesion between the first adhesion reinforcing portion 14 and the ACF 13 is higher than the adhesion between the surface of the shared terminal 11 and the ACF 13. The shared terminal 11 of the example described herein includes on the surface thereof the coating film 11b formed of ITO. The first adhesion reinforcing portion 14 is formed of, for example, $SiO_2$ (silicon dioxide). Silicon dioxide has higher adhesion to the ACF 13 than to ITO. Since the shared terminal 11 is provided with the first adhesion reinforcing portion 14 as described above, even when the adhesion between the coating film 11b and the ACF 13 is low, the stability of adhesion between the shared terminal 11 and the ACF 13 can be secured. That is, it is possible to suppress the peeling off of the ACF 13 from the shared terminal 11. In other words, it is possible to suppress a reduction in pressure acting from the ACF 13 to the shared terminal 11. In the example shown in FIGS. 3 and 4B, two openings are formed in the shared terminal 11, and the first adhesion reinforcing portion 14 is formed in each of the two openings. The number of openings formed in the shared terminal 11 (i.e., the number of first adhesion reinforcing portions 14 provided in the shared terminal 11) is not necessarily limited to two. Only one opening may be formed in the shared terminal 11. Moreover, more than two openings may be formed in the shared terminal 11. In the example shown in FIG. 3, an opening and the first adhesion reinforcing portion 14 are not formed in the dedicated terminal 12. Moreover, in the example shown in FIG. 3, the opening of the shared terminal 11 and the first adhesion reinforcing portion 14 are rectangular. The shape of the opening and the first adhesion reinforcing portion 14 is not limited to be rectangular, and may be appropriately changed. For example, the first adhesion reinforcing portion 14 and the opening may be circular.

In the example shown in FIG. 4B, the opening is formed in the terminal main body 11a of the shared terminal 11, and the first adhesion reinforcing portion 14 is formed inside the opening. The first adhesion reinforcing portion 14 is formed as a projection that projects upward from the substrate 10. In the embodiment described herein, the first adhesion reinforcing portion 14 corresponds to a first projection in the invention. The coating film 11b of the shared terminal 11 partially overlaps the first adhesion reinforcing portion 14. Specifically, the coating film 11b overlaps the side surfaces of the first adhesion reinforcing portion 14, and extends to the edge of the upper surface of the first adhesion reinforcing portion 14. At least a portion of the upper surface of the first adhesion reinforcing portion 14 is exposed through the opening formed in the coating film 11b, and this exposed portion 14a adheres to the ACF 13. The coating film 11b may not necessarily have the portion overlapping the first adhesion reinforcing portion 14.

As described above, the stacked structure composed of the plurality of layers is formed in the display region S. The first adhesion reinforcing portion 14 is formed of the same material as the material of any of the plurality of layers constituting the stacked structure. By doing this, it is possible to suppress an increase in the manufacturing cost of the display device 1. In one example, the first adhesion reinforcing portion 14 is formed of the same material as the insulating films formed in the display region S. As described above, the first adhesion reinforcing portion 14 is formed of, for example, $SiO_2$. Silicon dioxide is used for, for example, the interlayer insulating film 47 described above. The material of the first adhesion reinforcing portion 14 is not necessarily limited to those of the interlayer insulating film 47 or $SiO_2$ constituting the interlayer insulating film 47 and other materials may be used as long as the material has higher adhesion to the ACF 13 than to the surface of the shared terminal 11. Moreover, the first adhesion reinforcing portion 14 is preferably formed in the same layer as the insulating films (more specifically, the interlayer insulating film 47) formed in the display region S. By doing this, the first adhesion reinforcing portion 14 and the insulating film of the display region S can be formed in one manufacturing step.

As shown in FIGS. 4A and 4B, a plurality of second adhesion reinforcing portions 15 formed of the same material as the first adhesion reinforcing portion 14 are formed on the substrate 10. The second adhesion reinforcing portion 15 is formed as a projection that projects upward from the substrate 10, similarly to the first adhesion reinforcing portion 14, and adheres to the ACF 13. Each of the shared terminal 11 and the dedicated terminal 12 is located between two second adhesion reinforcing portions 15. The adhesion between the second adhesion reinforcing portion 15 and the ACF 13 is higher than the adhesion between the surface of the shared terminal 11 and the ACF 13. According to this structure, the stability of connection between the terminals 21 of the FPC 20, and the shared terminals 11 and the dedicated terminals 12 can be further effectively secured. As shown in FIG. 3, in the example described herein, also each of the electrical lines 11d and the electrical lines 12d is located between two second adhesion reinforcing portions 15. As shown in FIG. 3, in the example described herein, the plurality of second adhesion reinforcing portions 15 are connected to one another at the edge (specifically, the lower edge) of the substrate 10. The plurality of second adhesion reinforcing portions 15 may be independent of one another. In the embodiment described herein, the second adhesion reinforcing portion 15 corresponds to a second projection in the invention.

The first adhesion reinforcing portion 14 and the second adhesion reinforcing portion 15 are formed of the same material as the insulating film constituting the stacked structure in the display region S. According to this configuration, it is possible to suppress an increase in the manufacturing cost of the display device 1. The first adhesion reinforcing portion 14 and the second adhesion reinforcing portion 15 are formed of, for example, the same material as the interlayer insulating film 47 described above. Since an insulating material is used as the material of the second adhesion reinforcing portion 15, the second adhesion reinforcing portion 15 can be disposed between two terminals next to each other on the substrate 10. Similarly to the first adhesion reinforcing portion 14, also the second adhesion reinforcing portion 15 is preferably formed in the same layer as the insulating film (e.g., the interlayer insulating film 47) of the display region S.

As shown in FIG. 3, the terminal 21 of the FPC 20 of the example described herein has a smaller width than that of the shared terminal 11. The position of the opening of the shared terminal 11 (in other words, the position of the first adhesion reinforcing portion 14) avoids the position of the terminal 21 of the FPC 20 in a plan view of the shared terminal 11. That is, the opening of the shared terminal 11 and the first adhesion reinforcing portion 14 do not overlap the terminal 21 of the FPC 20 in the plan view of the shared terminal 11. According to this configuration, since the area of a region where the shared terminal 11 and the terminal 21 of the FPC 20 overlap each other can be secured, the electrical resistance therebetween can be sufficiently reduced. The terminal 21 of the FPC 20 may not necessarily have a smaller width than that of the shared terminal 11. In this case, the shared terminal 11 may protrude in the length direction thereof from the terminal 21. The term "length direction" as used herein means a direction orthogonal to the width direction of the shared terminal 11 (a direction indicated by D2 in FIG. 3). In the region of the shared terminal 11 protruding from the terminal 21, the opening described above and the first adhesion reinforcing portion 14 may be formed. Also with this structure, the stability of adhesion between the shared terminal 11 and the ACF 13 can be secured. Moreover, in a region of the shared terminal 11 overlapping the terminal 21 of the FPC 20, an opening of the shared terminal 11 may be formed. Then, the first adhesion reinforcing portion 14 may be formed in the opening.

As shown in FIG. 3, two terminals 21 of the FPC 20, which are disposed spaced apart from each other in the width direction, are connected to the shared terminal 11 of the example described herein. As shown in FIG. 3, the openings of the shared terminal 11 and the first adhesion reinforcing portions 14 are located between the two terminals 21 in the plan view of the shared terminal 11. According to this structure, since two terminals 21 are connected to one shared terminal 11, and the two terminals 21 avoid the position of the first adhesion reinforcing portion 14, the electrical resistance between the shared terminal 11 and the terminal 21 of the FPC 20 can be further effectively reduced. In the use of the display device 1, the same signal and power supply voltage are supplied to one shared terminal 11 from two terminals 21 connected thereto. Since the electrical resistance can be sufficiently reduced according to the structure of the terminals 21 of the FPC 20 and the shared terminal 11, the structure is particularly preferred for terminals to be used to apply a power supply voltage to the display device 1.

Figure 5:
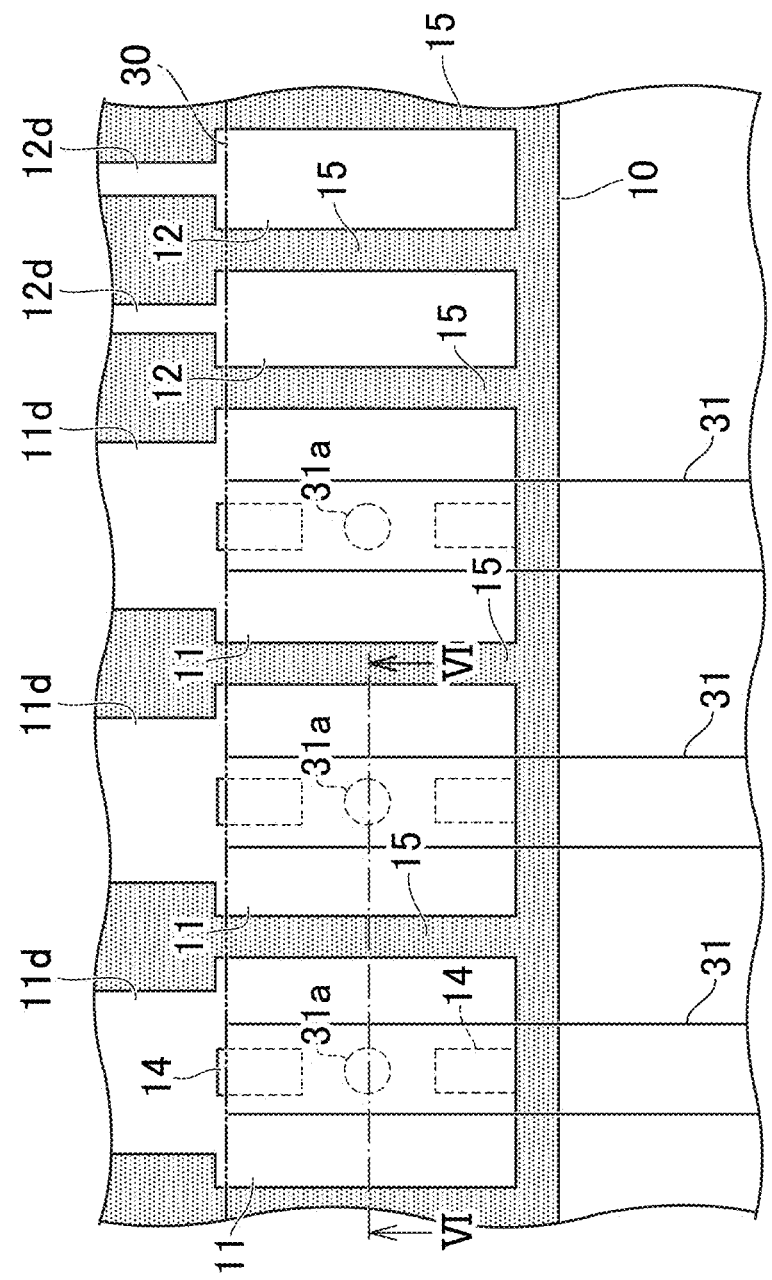
FIG. 5 is a plan view showing a positional relationship between first terminals and terminals of an FPC for inspection.
Figure 6:
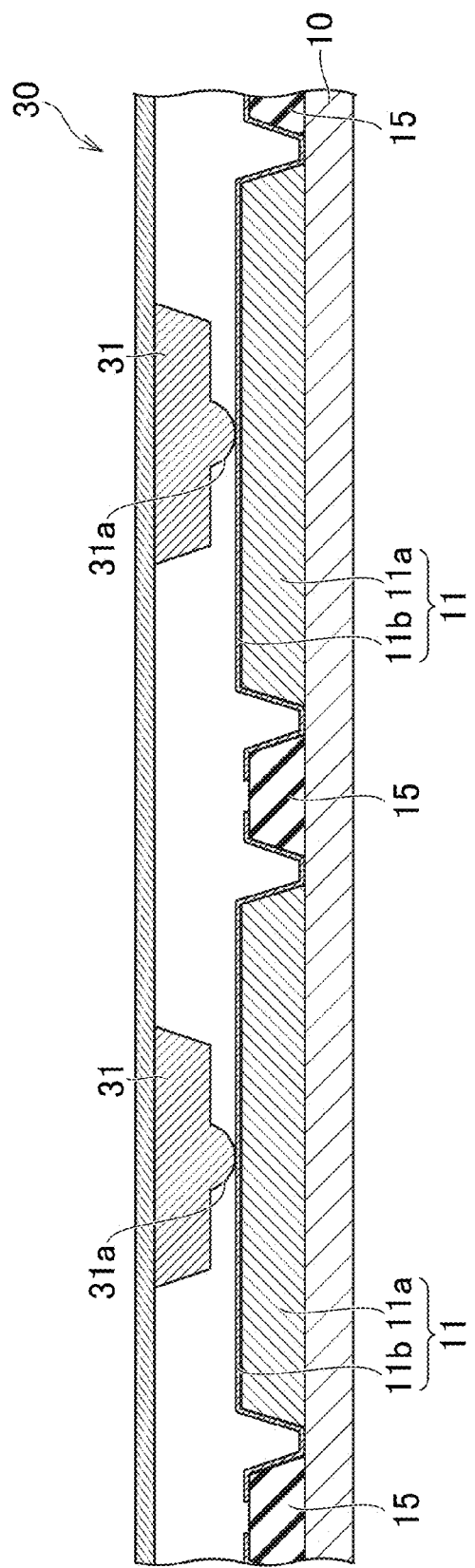
FIG. 6 is a cross-sectional view of the substrate and the FPC for inspection taken along a cutting plane indicated by the line VI-VI in FIG. 5.

The display device 1 (more specifically, the substrate 10 on which the stacked structure is formed) is inspected before the FPC 20 is attached to the substrate 10 in a manufacturing step of the display device 1. In one example, the shared terminals 11 are also used for the inspection. FIG. 5 is a plan view showing a positional relationship between the shared terminals 11 and terminals 31 of an FPC for inspection 30. FIG. 6 is a cross-sectional view of the substrate 10 and the FPC for inspection 30 taken along a cutting plane indicated by the line VI-VI in FIG. 5.

As shown in FIGS. 5 and 6, the FPC for inspection 30 is connected to the shared terminals 11 in the inspection of the substrate 10. The FPC 30 includes the terminals 31 at positions corresponding to the shared terminals 11, and the terminals 31 directly contact the shared terminals 11. In the example shown in FIG. 6, each of the terminals 31 includes a bump 31a that projects from the surface thereof. The shared terminal 11 contacts the bump 31a. In the example of FIG. 6, the bump 31a is formed at the center (center in the width and length directions) of the terminal 31.

As described above, the shared terminals 11 and the dedicated terminals 12 are formed on the substrate 10, and the shared terminal 11 has a larger width than that of the dedicated terminal 12. By disposing the shared terminal 11 with a wide width on the substrate 10, it becomes easy to use the shared terminal 11 in the inspection of the substrate 10. That is, since the width of the shared terminal 11 is large, a strict position adjustment between the shared terminal 11 and the terminal 31 of the FPC 30 becomes unnecessary. Further, by making the lengths of the substrate 10 and the FPC in the right-and-left direction substantially coincident with each other, the shared terminal 11 and the terminal 31 of the FPC 30 can be electrically connected to each other only by aligning the outer edge of the FPC 30 with the substrate 10, so that workability in inspection can be improved. Moreover, since the shared terminals 11 to which the terminals 21 of the FPC 20 are connected are also used in inspection, there is no need to form terminals dedicated to inspection on the substrate 10. As a result, the layout of terminals is facilitated also in a display device including a large number of terminals that have to be formed at the peripheral portion of the substrate 10 as in, for example, an organic EL display device.

Moreover, as shown in FIG. 3, the openings of the shared terminal 11 and the first adhesion reinforcing portions 14 are formed at positions avoiding a central region B of the shared terminal 11 in the length direction of the shared terminal 11 (the direction indicated by D2 in FIG. 3). That is, the first adhesion reinforcing portion 14 is disposed closer to ends (an edge 11e and an edge 11f) of the shared terminal 11 in the length direction than the center thereof in the length direction. By doing this, it is possible to secure the degree of freedom of the position at which the terminal 31 of the FPC for inspection 30 contacts the shared terminal 11. That is, even when the position of the terminal 31 of the FPC 30 (more specifically, the position of the bump 31a) is shifted in the width direction of the shared terminal 11, the electrical connection between the terminal 31 of the FPC 30 and the shared terminal 11 can be established, and therefore, workability in inspection can be improved. In the example shown in FIG. 3, two openings and two first adhesion reinforcing portions 14 are formed in the shared terminal 11. The two openings are located away from each other in the length direction of the shared terminal 11. In other words, the shared terminal 11 of the example of FIG. 3 has substantially an "H" shape, and the central region B is located between the two openings. With this configuration, a region where the first adhesion reinforcing portion 14 is not formed (i.e., a region where the terminal 31 of the FPC for inspection 30 can contact the shared terminal 11) is secured at the central region B of the shared terminal 11, so that it is possible to secure the degree of positional freedom of the terminal 31 of the FPC for inspection 30 in the width direction of the shared terminal 11. Moreover, as shown in FIG. 3, an end of the opening of the shared terminal 11 and an end of the first adhesion reinforcing portion 14 are preferably located at each of the edge 11e and the edge 11f of the shared terminal 11 in the length direction thereof. By doing this, it becomes easier to secure the region where the terminal 31 of the FPC for inspection 30 can contact the shared terminal 11 at the center of the shared terminal 11.

The opening formed in the shared terminal 11 may not necessarily have a closed edge. That is, the opening formed in the shared terminal 11 may be a recess in the plan view of the shared terminal 11. In the example of FIG. 3, an end of one of the two openings formed in the shared terminal 11 is located at the edge 11e of the shared terminal 11 in the length direction thereof. This opening is a recess opened toward the edge 11e (a recess opened toward the lower side in FIG. 3).

The shared terminal 11, the dedicated terminal 12, the first adhesion reinforcing portion 14, and the second adhesion reinforcing portion 15 are formed, for example, as follows: (1) In a step of forming the interlayer insulating film 47 in the display region S, an insulating film of the same material (specifically, SiO$_2$) as the interlayer insulating film 47 is formed in the region outside the display region S. (2) Then, the insulating film is removed by etching at positions of the shared terminal 11 and the dedicated terminal 12 and positions of the electrical lines 11d and the electrical lines 12d. The insulating film (insulator) left at the positions through etching serves as the first adhesion reinforcing portion 14 and the second adhesion reinforcing portion 15. (3) In a later step of forming electrodes (the electrodes of the TFT 41 or the lower electrode 51), metal (e.g., Al) of the same material as the electrodes is patterned at the positions from which the insulating film is removed. This patterned metal serves as the terminal main body 11a of the shared terminal 11, the terminal main body of the dedicated terminal 12, and the wires 11d and 12d. (4) Thereafter, a film of ITO is formed so as to cover the terminal main bodies of the terminals 11 and 12 and the wires 11d and 12d. The ITO serves as the coating film 11b and the coating film of the dedicated terminal 12. (5) Thereafter, the ITO on the first adhesion reinforcing portion 14 and the second adhesion reinforcing portion 15 is removed to expose the first adhesion reinforcing portion 14 and the second adhesion reinforcing portion 15 through the ITO. The above is an example of a procedure to form the shared terminal 11, the dedicated terminal 12, the first adhesion reinforcing portion 14, and the second adhesion reinforcing portion 15. The method for manufacturing the substrate 10 is not limited to this example. For example, the first adhesion reinforcing portion 14 and the second adhesion reinforcing portion 15 may be formed of the same material as the gate insulating film 46 in a step of forming the gate insulating film 46. In this case, the shared terminal 11 and the dedicated terminal 12 may be formed of the same material as the gate electrode 43 in a step of forming the gate electrode 43 of the TFT 41.

In the display device 1 as has been described above, the opening is formed in the shared terminal 11, and the first adhesion reinforcing portion 14 that adheres to the ACF 13 is formed inside the opening. The first adhesion reinforcing portion 14 is formed of a material having higher adhesion to the ACF 13 than the material (specifically, ITO in the above description) of the surface of the shared terminal 11. According to this configuration, even when the adhesion between the material constituting the surface of the terminal 11 and the ACF 13 is low, the stability of adhesion between the shared terminal 11 and the ACF 13 can be secured. That is, it is possible to suppress the peeling off of the ACF 13 from the shared terminal 11. As a result, it is possible to secure the stability of connection between the shared terminal 11 and the terminal 21 of the FPC 20.

The invention is not limited to the display device 1 described above, and various modifications may be made.

Figure 7:
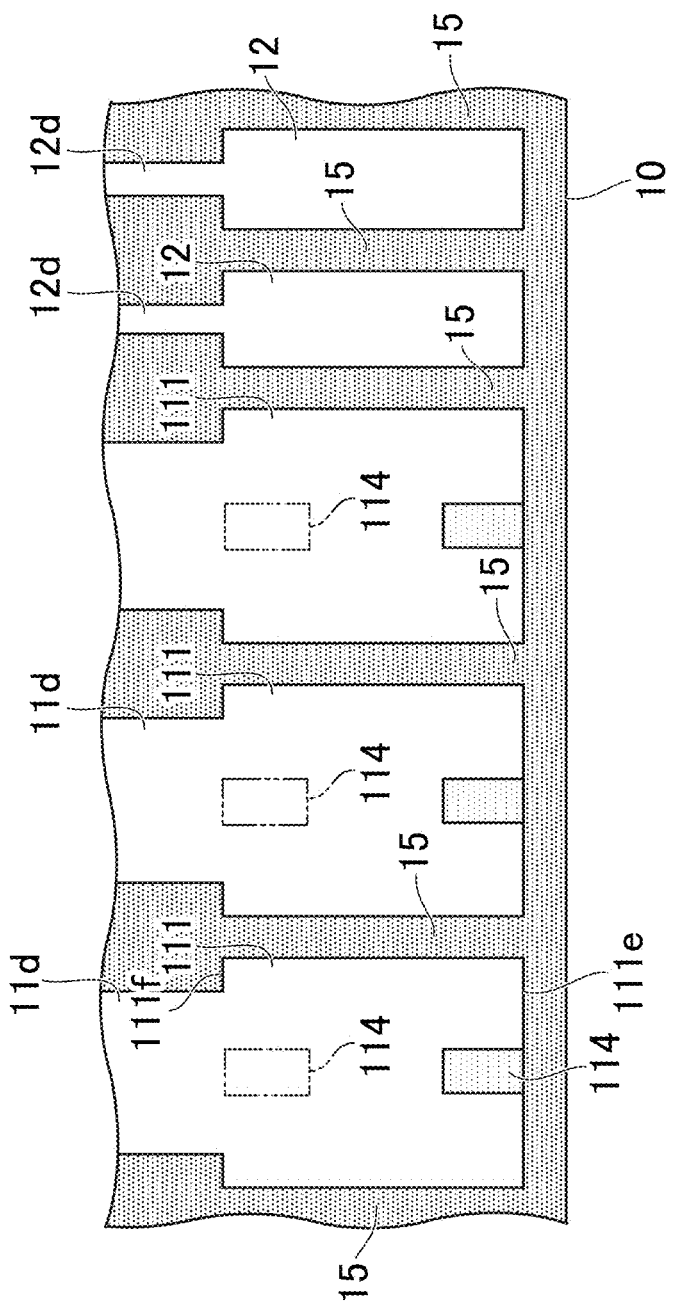
FIG. 7 is a plan view showing a modified example of the first terminals.

FIG. 7 is a plan view showing a modified example of the shared terminal 11. In FIG. 7, the same portions as those described above are denoted by the same reference numerals and signs. An opening is formed also in a shared terminal 111 shown in FIG. 7, and a first adhesion reinforcing portion 114 is formed inside the opening. The opening of the shared terminal 111 and the first adhesion reinforcing portion 114 are formed at positions avoiding the position of the terminal 21 of the FPC 20. Specifically, the opening of the shared terminal 111 is located between two terminals 21 (refer to FIG. 3) connected to the shared terminal 111. In the example of FIG. 7, the number of openings of the shared terminal 111 is one, which is different from the shared terminal 11. Then, the opening of the shared terminal 111 and the first adhesion reinforcing portion 114 may be formed such that the ends thereof are in contact with one edge 111e (the lower edge in the example of FIG. 7) of the shared terminal 111 in the length direction thereof. Moreover, the opening of the shared terminal 111 and the first adhesion reinforcing portion 114 may be formed such that the ends thereof are located at an edge 111f of the shared terminal 111 on the side opposite to the edge 111e as shown by the two-dot chain line in FIG. 7.

Figure 8:
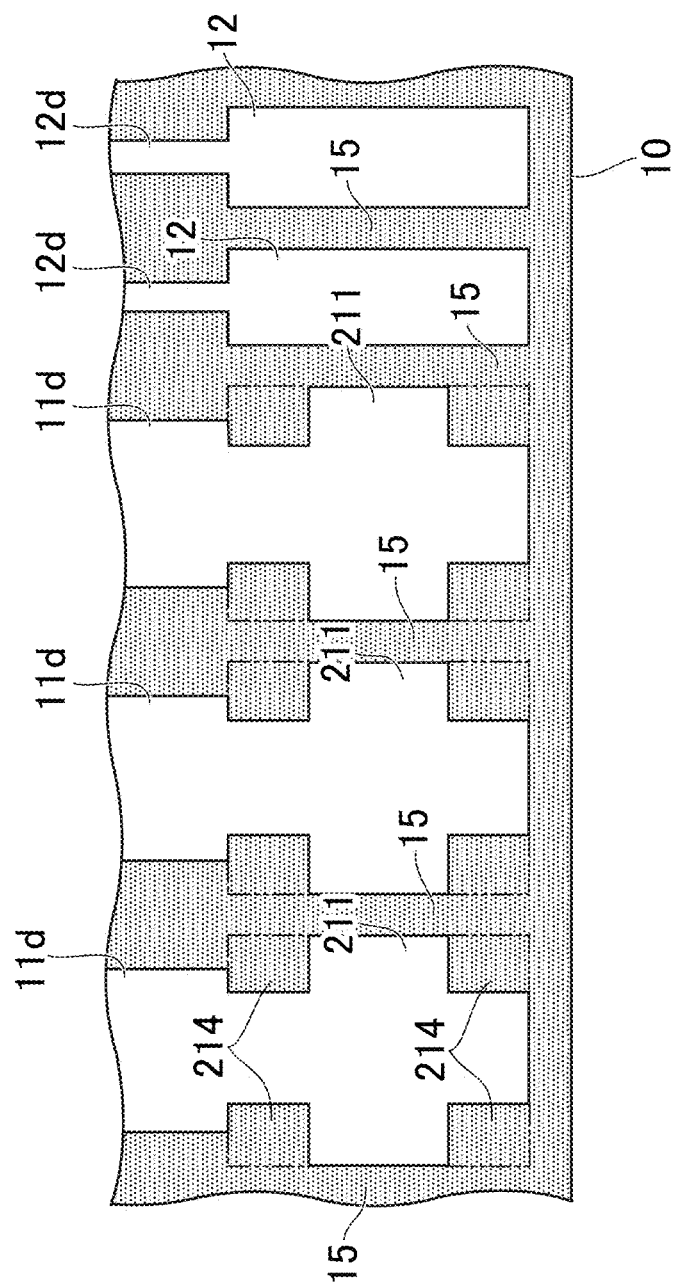
FIG. 8 is a plan view showing another modified example of the first terminals.

FIG. 8 is a plan view showing another modified example of the shared terminal 11. In FIG. 8, the same portions as those described above are denoted by the same reference numerals and signs. Openings are formed also in a shared terminal 211 shown in FIG. 8, and first adhesion reinforcing portions 214 are formed inside the openings. The opening of the shared terminal 211 and the first adhesion reinforcing portion 214 are formed at positions overlapping the terminals 21 of the FPC 20. Specifically, the opening of the shared terminal 211 and the first adhesion reinforcing portion 214 are formed at each of four corners of the shared terminal 211 having a rectangular shape. Hence, in the example of FIG. 8, the first adhesion reinforcing portion 214 is connected with the second adhesion reinforcing portion 15. In the example of FIG. 8, the opening of the shared terminal 211 and the first adhesion reinforcing portion 214 are formed at the four corners of the shared terminal 211.

On the substrate 10 described above, two types of terminals (specifically, the shared terminal 11 and the dedicated terminal 12) with different widths are formed. However, two types of terminals may not necessarily be formed on the substrate 10.

Moreover, in the above description, the opening and the first adhesion reinforcing portion 14 are not provided in the dedicated terminal 12. However, the opening and the first adhesion reinforcing portion 14 may be provided also in the dedicated terminal 12.

Moreover, in the above description, the anisotropic conductive film 13 is used as an anisotropic conductive member. However, an anisotropic conductive paste may be used as an anisotropic conductive member.

It is understood that other modifications and alterations that will occur to those skilled in the art also fall within the scope of the invention as long as the modifications and alterations include the gist of the invention.

What is claimed is:

1. A display device comprising:
   a substrate including a display region and a terminal formed in a region outside the display region;
   an anisotropic conductive member disposed on the terminal;
   a flexible printed board connected to the terminal via the anisotropic conductive member;
   at least one opening formed in the terminal; and
   a first projection disposed inside the opening of the terminal and adhered to the anisotropic conductive member.

2. The display device according to claim 1, wherein adhesion between the first projection and the anisotropic conductive member is higher than adhesion between the terminal and the anisotropic conductive member.

3. The display device according to claim 1, wherein a stacked structure including a plurality of layers is formed in the display region of the substrate, and a material of the first projection is the same as a material of any of the plurality of layers.

4. The display device according to claim 1, wherein the first projection is formed of SiO$_2$.

5. The display device according to claim 1, wherein a thin film transistor including at least one insulating film is formed on the substrate, and the first projection is located in the same layer as the insulating film.

6. The display device according to claim 1, wherein
the terminal includes a metal film and a conductive film covering the metal film,
the conductive film overlaps an upper surface of the first projection and side surfaces of the first projection, and
the conductive film exposes at least a portion of the upper surface.

7. The display device according to claim 1, further comprising:
a second terminal next to the terminal; and
a second projection disposed between the terminal and the second terminal and adhered to the anisotropic conductive member.

8. The display device according to claim 7, wherein
adhesion between the second projection and the anisotropic conductive member is higher than adhesion between the terminal and the anisotropic conductive member.

9. The display device according to claim 7, wherein
the first projection and the second projection are formed of a same material.

10. The display device according to claim 1, wherein
the opening is formed at a position not overlapping a terminal of the flexible printed board in a plan view.

11. The display device according to claim 1, wherein
the flexible printed board includes two terminals connected to the terminal formed on the substrate, and
the opening is located between the two terminals in a plan view.

12. The display device according to claim 11, wherein
a power supply voltage is supplied from the two terminals to the terminal.

13. The display device according to claim 1, wherein
the opening is formed at a position not overlapping a central region of the terminal in a length direction thereof in a plan view.

14. The display device according to claim 13, wherein
the terminal includes the opening and a second opening disposed away from the opening, and
the central region is located between the opening and the second opening.

15. The display device according to claim 1, further comprising a third terminal disposed aligned with the terminal and not including an opening, wherein
a width of the terminal is larger than a width of the third terminal.

16. The display device according to claim 1, wherein
the first projection is in contact with an end of the terminal.

17. The display device according to claim 1, wherein further comprising a plurality of first projections including the first projection,
the terminal is rectangular and includes four corner portions, and
each of the first projections is disposed at each of the four corner portions.

18. A display device comprising:
a substrate;
a plurality of terminals disposed along one side of the substrate;
an anisotropic conductive member disposed on the plurality of terminals; and
a flexible printed board connected to the plurality of terminals via the anisotropic conductive member, wherein
the plurality of terminals include a first terminal, a second terminal, and a third terminal arranged in this order,
each of the first terminal, the second terminal, and the third terminal includes at least one opening,
a first projection adhered to the anisotropic conductive member is disposed inside the opening,
a second projection adhered to the anisotropic conductive member is disposed between the first terminal and the second terminal,
a third projection adhered to the anisotropic conductive member is disposed between the second terminal and the third terminal,
the second projection and the third projection are connected at a region between the second terminal and the one side, and
adhesion between the first projection and the anisotropic conductive member is higher than adhesion between the plurality of terminals and the anisotropic conductive member.

19. The display device according to claim 18, wherein
a thin film transistor including at least one insulating film is formed on the substrate, and
the first projection is located in the same layer as the insulating film.

20. The display device according to claim 18, wherein
the first projection, the second projection, and the third projection are formed of a same material.

* * * * *